United States Patent [19]

Feygenson

[11] Patent Number: 4,860,085
[45] Date of Patent: Aug. 22, 1989

[54] SUBMICRON BIPOLAR TRANSISTOR WITH BURIED SILICIDE REGION

[75] Inventor: Anatoly Feygenson, Reading, Pa.

[73] Assignee: American Telephone and Telegraph Company, AT&T Bell Laboratories, Murray Hill, N.J.

[21] Appl. No.: 238,990

[22] Filed: Aug. 24, 1988

Related U.S. Application Data

[63] Continuation of Ser. No. 871,264, Jun. 6, 1986, abandoned.

[51] Int. Cl.$^4$ .................... H01L 29/04; H01L 29/72; H01L 23/48; H01L 29/34
[52] U.S. Cl. ........................ 357/59; 357/34; 357/67; 357/54
[58] Field of Search ............ 357/59 H, 59 I, 34, 357/67, 54

[56] References Cited

U.S. PATENT DOCUMENTS

| | | | |
|---|---|---|---|
| 3,833,429 | 9/1974 | Monma et al. | 148/1.5 |
| 3,839,104 | 10/1974 | Yuan | 148/188 |
| 4,127,864 | 11/1978 | Jochems | 357/44 |
| 4,151,009 | 4/1979 | Ogureck et al. | 148/1.5 |
| 4,259,680 | 3/1981 | Lepselter et al. | 357/35 |
| 4,338,138 | 7/1982 | Cavaliere et al. | 148/1.5 |
| 4,347,654 | 9/1982 | Allen et al. | 29/576 B |
| 4,481,706 | 11/1984 | Roche | 357/59 H |
| 4,495,010 | 1/1985 | Kranzer | 148/175 |
| 4,507,171 | 3/1985 | Bhatia et al. | 357/59 H |
| 4,566,176 | 1/1986 | Moors et al. | 29/578 |
| 4,641,170 | 3/1987 | Ogura et al. | 357/34 |

OTHER PUBLICATIONS

"Prospects of SST Technology . . . " IEDM '85, T. Sakai et al, pp. 18-21.

Primary Examiner—Rolf Hille
Assistant Examiner—Robert P. Limanek
Attorney, Agent, or Firm—Wendy W. Koba

[57] ABSTRACT

A high performance bipolar transistor structure is disclosed which exhibits an extremely low extrinsic base resistance by virtue of a silicide layer which is included in the base contact portion of the structure. The silicide layer is situated to be electrically in parallel with the conventional heavily-doped polysilicon base contact region, where a vertical polysilicon runner is used to provide a self-aligned electrical contact to the base. The parallel combination of the low resistivity (0.5-4 ohm/square) silicide with the polysilicon (sheet resistance of 10-100 ohm/square) results in a low extrinsic base resistance on the order of 0.5-4 ohm/square. The disclosed device also includes a submicron emitter size, defined by vertical oxide sidewalls above the base region, which further improves the high frequency performance of the device.

5 Claims, 3 Drawing Sheets

SUBMICRON BIPOLAR TRANSISTOR WITH BURIED SILICIDE REGION

This application is a continuation of application Ser. No. 871,264 filed June 6, 1986, now abandoned.

BACKGROUND OF THE INVENTION

1. Technical Field

The present invention relates to a submicron bipolar transistor structure with a buried silicide region and, more particularly, to a structure and method of fabricating the same which provides reduced extrinsic base resistance and a submicron emitter structure.

2. Description of the Prior Art

The direction of technology in the field of semiconductor devices is toward a device structure with high speed and low power consumption. This structure demands active regions which are shallow in depth and placed as close together as possible. In particular, it is required that the emitter region be made as shallow as possible and the width of the emitter-base junction be made as narrow as possible.

Many prior art structures and techniques exist which address these issues. U.S. Pat. No. 3,833,429 issued to Y. Monma et al on Sept. 3, 1974 describes a high speed bipolar transistor structure with a dual nitride film wherein the emitter diffusion will occur only in an overlapped portion between the two films. Thus, the emitter size may be substantially reduced. U.S. Pat. No. 4,151,009 issued to F. M. Ogureck et al on Apr. 24, 1979 discloses a high speed bipolar transistor structure with ion implanted compensating impurities formed in the base region near the base-collector junction to reduce the effective base width. An alternative structure is disclosed in U.S. Pat. No. 4,338,138 issued to J. R. Cavaliere et al on July 6, 1982. The Cavaliere et al structure exhibits reduced base-collector capacitance due to the very small area of the base-collector junction and a longated conductivity region surrounding the entire structure. A method of forming very shallow regions is disclosed in U.S. Pat. No. 4,494,010 issued to D. Kanzer on Jan. 22, 1985 wherein undoped polysilicon is first applied to the substrate and subsequently doped by ion implantation in selected regions to form the shallow contacts. A relatively new submicron bipolar structure has been proposes by T. Sakai et al in a paper entitled "Prospects of SST Technology for High Speed LSI", appearing in IEDM 85 at pp. 18–21. This structure, referred to as super self-aligned, includes submicron width base electrodes as well as submicron base and emitter contacts. Doped polysilicon is used as a diffusion source for the base and emitter regions to provide these submicron features. The resultant structure exhibits a considerably reduced collector-base capacitance.

One problem with these and other prior art arrangements is the value of the extrinsic base resistance associated with the final structure. At very high frequencies, this extrinsic base resistance often becomes the dominant impediment to improved performance. Therefore, it is necessary to reduce this resistance to as small a value as possible. One structure which exhibits reduced extrinsic base resistance is disclosed in U.S. Pat. No. 4,573,256 issued to J. S. Lechaton et al on Mar. 4, 1986. In this structure, a p+ region is formed in the extrinsic base region by ion implanting with a p type dopant to a depth less than the emitter region. The use of this high conductivity p+ region closely adjacent to the emitter thus reduces the extrinsic base resistance.

It is yet desirable to find alternative methods of reducing the extrinsic base resistance and submicron size active regions which require fewer masking and implanting procedures than associated with the structures described above.

SUMMARY OF THE INVENTION

The problem remaining in the prior art is addressed by the present invention which relates to a submicron bipolar transistor structure with a buried silicide region and, more particularly, to such a structure with reduced extrinsic base resistance and a submicron emitter structure.

It is an aspect of the present invention to provide a substantially reduced extrinsic base resistance by incorporating a buried silicide layer in parallel with conventional heavily-doped polysilicon base contact layer. By providing this electrically parallel arrangement, the extremely low resistance of the silicide dominates the sheet resistance of the polysilicon, resulting in an extrinsic base resistance as low as 1–4 ohm/square.

Additionally, the conventional use of doped polysilicon as a diffusion source for the emitter is eliminated by a two-step process whereby the emitter is first formed by ion implantation and the polysilicon is then doped by the same dopant as the emitter. Thus, the emitter profile is determined by ion implantation rather than diffusion.

As a further aspect of the invention, a nitride overhang layer is used to define the emitter size prior to the ion implantation. Thus, a submicron emitter can easily be fabricated. Additionally, this nitride overhang is used to provide a self-aligned base contact.

Other and further aspects of the present invention will beciome apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

The complete fabrication process which may be used to form the transistor structure of the present invention will now be described in sufficient detail so as to allow one skilled in the art to fabricate such a device. It is to be understood that a device of complementary structure can be fabricated merely by changing the dopants used to form the n and p regions.

Figure 1:
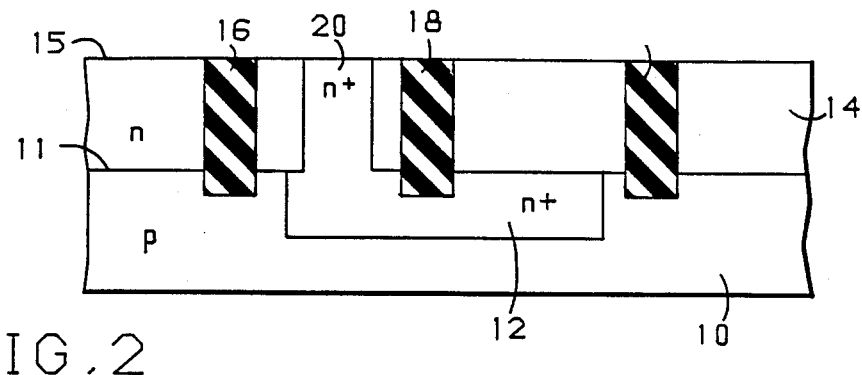
FIGS. 1–7 represent an successive stages in a exemplary fabrication process which may be used to form the submicron bipolar transistor structure with a buried silicide layer in accordance with the present invention.

FIG. 1 contains a vertical cross-section of the present device at an early stage in the fabrication. The starting material for the device is a silicon substrate 10, which is doped to comprise a p-type conductivity. A buried n+ collector contact region 12 is formed in top surface 11 of substrate 10, with appropriate areas of substrate 10 masked so as to allow the formation of buried collector contact 12 in only the desired area. Such masking techniques are well-known in the art and need not be repeated here. After the formation of collector contact region 12, an epitaxial layer 14 is grown over top surface 11 so as to completely cover both top surface 11 and buried collector contact 12. This epitaxial layer 14 is formed to comprise an n-type conductivity. All of these processes are standard in the formation of npn bipolar transistors.

The next steps in the fabrication process refer to the formation of isolation regions which are used to insulate the transistor from other devices formed in the same substrate, as well as to isolate the eventual active regions of the finished transistor device. As shown in FIG. 1, isolation region 16, in this case illustrated as dielectric isolation, is used to insulate the transistor from adjacent structures. It is to be understood that various other types of isolation, for example, pn junction back-biasing, may be used to provide this necessary isolation. Dielectric region 18 is used to isolate the transistor base-emitter region from buried collector contact 12. Lastly, an n+ deep collector contact 20 to buried collector region 12 is formed in the top surface 15 of n epitaxial layer 14, using standard lithography, etching and diffusion or ion implantation techniques. Contact 20 is typically formed with a phosphorous or arsenic dopant.

Figure 2:
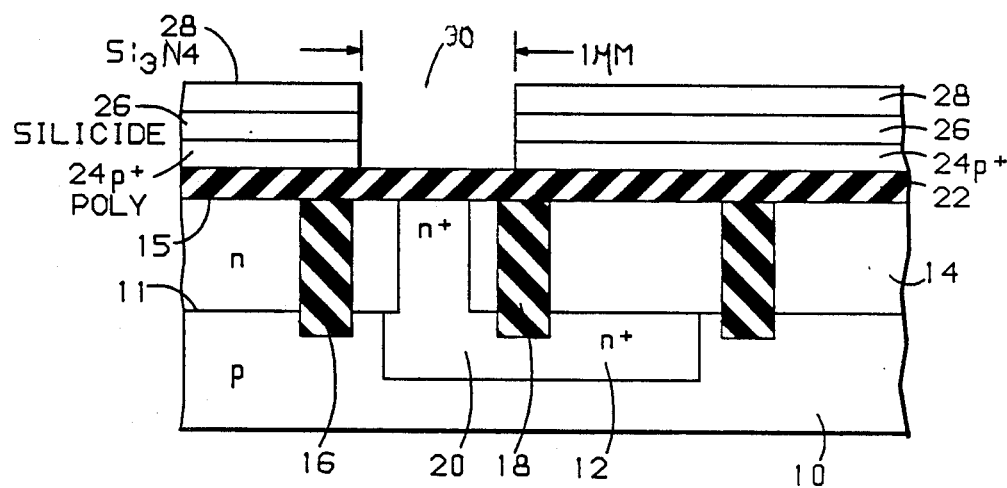

The buried silicide layer, which is essential to the formation of the transistor structure of the present invention, is formed during the next sequence of processing steps, illustrated in FIG. 2. Here, an oxide layer 22 is first grown (or deposited) over the top surface 15 of epitaxial layer 14 so as to completely cover top surface 15. A low temperature oxide (LTO) may be used for this purpose, where oxide layer 22 is formed to comprise a thickness anywhere in the range of, for example, 100–50,000 Å. A p+ heavily-doped polysilicon layer 24 is then formed to completely cover oxide layer 22. Boron may be used as the p-type dopant for the polysilicon, and polysilicon layer 24 grown to a thickness of, for example, 200–2000 Å. A silicide layer 26, which will form the buried silicide contact of the final structure, is next formed over heavily-doped polysilicon layer 24. In forming this layer, a silicide may be directly deposited over polysilicon layer 24 or, alternatively, a metal layer may be deposited and reacted with polysilicon layer 24 to form the silicide. Other various techniques of forming silicide layer 26 may also be utilized in practicing the present invention. In general, silicide layer 26 is formed to comprise a thickness in the approximate range of 50–2500 Å, although other possible thicknesses may be used. Lastly, a silicon nitride surface layer 28 is formed to cover buried silicide layer 26, where silicon nitride layer 28 may comprise a thickness in the range of 200–1000 Å. Upon the completion of these four layers, a contact window 30 is opened through layers 24, 26 and 28 (oxide layer 22 remaining intact) above the position of deep collector contact 20. Conventional masking and etching techniques are used to form contact window 30, which using conventional lithography, has a minimum opening of 1 μm.

Figure 3:
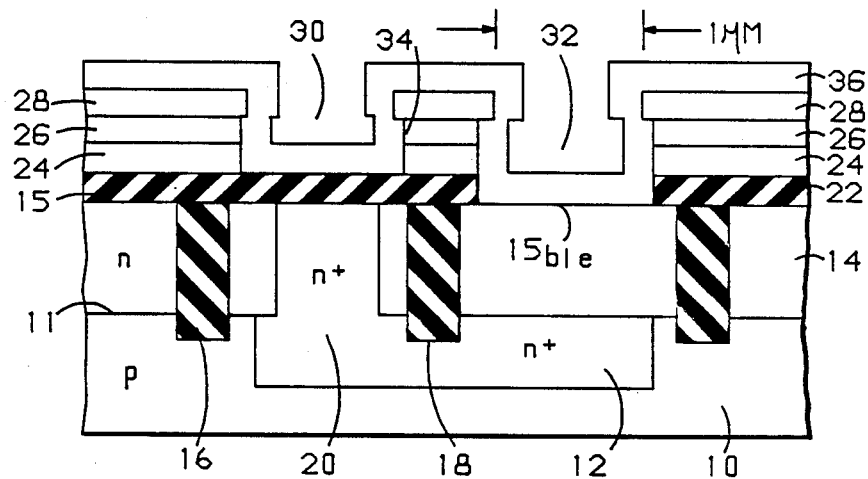

The formation of the base/emitter contact window and the submicron emitter region are illustrated in FIG. 3. A base/emitter window 32 is formed at surface location $15_{b,e}$ of epitaxial layer 14 by masking the remaining surface area and etching the exposed region. In this instance, base/emitter contact window 32 is etched through the entire composite layer structure formed by oxide layer 22, heavily-doped polysilicon 24, silicide 26, and silicon nitride 28. As with collector contact 30, base/emitter contact window 32 has a minimum width of 1 μm, as determined by present optical lithography techniques.

After the formation of base/emitter contact window 32, layers 24, 26 and 28 are etched with a material which will preferentially etch polysilicon 24 and silicide 26 with respect to silicon nitride 28. That is, an etchant is utilized which is known to etch polysilicon and silicide at a faster rate than it will etch silicon nitride. One etchant known to exhibit this property is a diluted mixture of HF and $HNO_3$. This etching is performed for a predetermined period of time sufficient to create a nitride overhang region 34, where region 34 may have a width in the range of, for example, 0.1–0.45 μm. An undoped polysilicon layer 36 is then deposited over the etched structure, where polysilicon layer 36 will conformally coat the remaining nitride layer, following the contour of etched layers 22, 24, 26 and 28.

Figure 4:
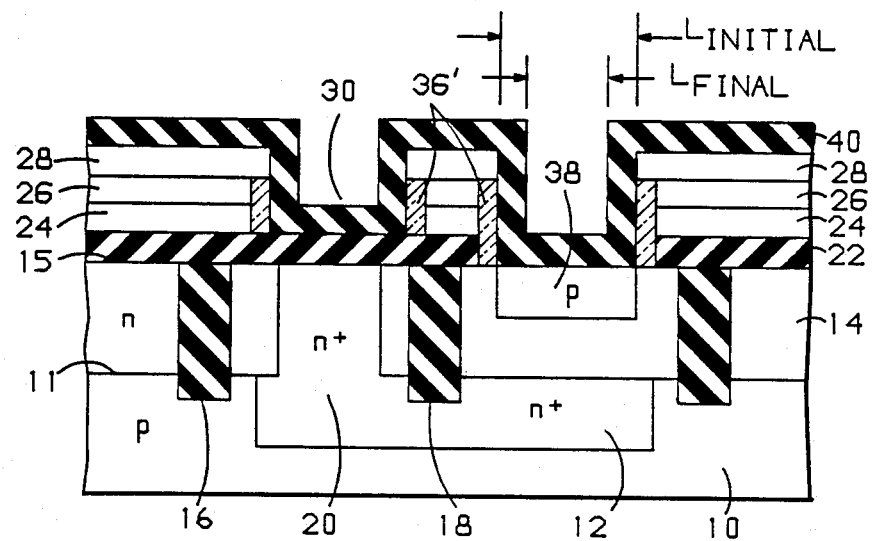

The combination of nitride overhang region 34 and undoped polysilicon layer 36 is used in accordance with the present invention to form the submicron-sized emitter region of the resultant structure. In particular, as illustrated in FIG. 4, undoped polysilicon layer 36 is reactively-ion etched (RIE) so as to remove the horizontal components of layer 36 and leave only those vertical portions which formed under nitride overhang 34. These remaining polysilicon regions 36' are hatched in FIG. 4 for illustrative purposes only. Subsequent to the RIE process, shallow base region 38 is formed using ion implantation through base/emitter window 32. As mentioned above, boron (or $BF_2$) may be used for this ion implantation process. Once base region 38 is formed, an oxide layer 40 is formed over the top surface of the structure, where as before, a low temperature oxide may be use. Oxide layer 40 is formed to comprise a thickness, denoted $L_{LTO}$, of approximately 0.45 μm, where this thickness is used as described below to define the eventual size of the emitter region. In particular, the final emitter size, $L_{final}$, is defined by the relation $$L_{final} = L_{initial} - 2 \times L_{LTO} \tag{1},$$

where $L_{initial}$ is the typical 1 μm-sized opening of base/emitter window 32. Therefore, for a 0.45 μm thickness of oxide layer 40, the final emitter size is the quantity (1.0−2×0.45), or 0.1 μm. This substantially submicron emitter size is significantly smaller than the dimensions which may be achieved using conventional optical lithography or any other advanced photolithography techniques.

Figure 5:
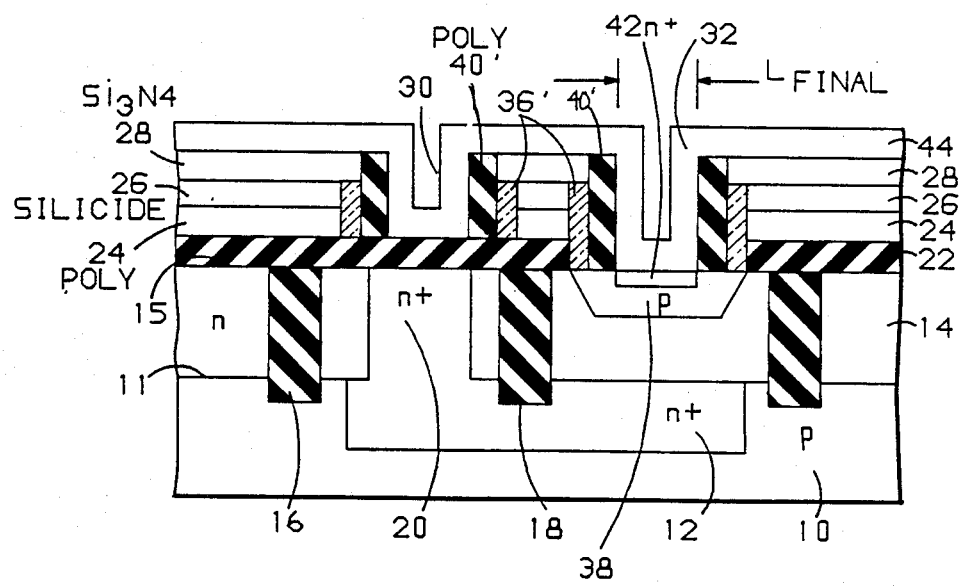

FIG. 5 illustrates the next steps in the fabrication process, those related to the formation of the emitter region. Reactive ion etching is again utilized to remove the horizontal portions of oxide layer 40, leaving the vertical sidewalls denoted 40' in FIG. 5. Sidewalls 40' in base/emitter contact window 32 are thus utilized as the outer boundaries for the formation of the emitter region. In particular, emitter region 42 is formed by ion implantation through open region of window 32 (indicated by the notation $L_{final}$ in the figure), the remaining portion of the structure being masked from this implantation. Arsenic is often used to create the n++ conductivity of emitter region 42 during the ion implant process. An undoped polysilicon layer 44 is then deposited over the complete structure.

Figure 6:
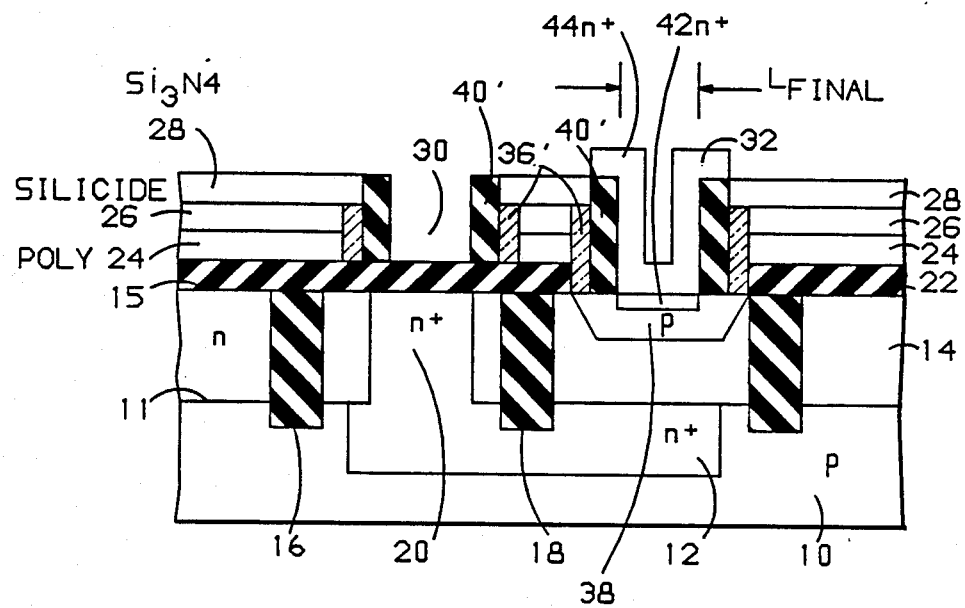

Undoped polysilicon layer 44 is utilized to define the emitter contact structure, where polysilicon layer 44 is etched to remove all of the deposited polysilicon except that which is located in base/emitter contact window 32. This structure is illustrated in FIG. 6. In order to form the contact to emitter region 42, the remaining portion of polysilicon layer 44 is ion implanted with the same dopant, possibly arsenic, as is used in the formation of emitter region 42. This double ion implantation process (for emitter 32 and emitter contact 44) is considered to be preferable over the conventional prior art technique of utilizing doped polysilicon and forming the emitter contact through diffusion from the doped polysilicon. This is due to the fact that ion implantation techniques are better controlled than known diffusion processes.

Figure 7:
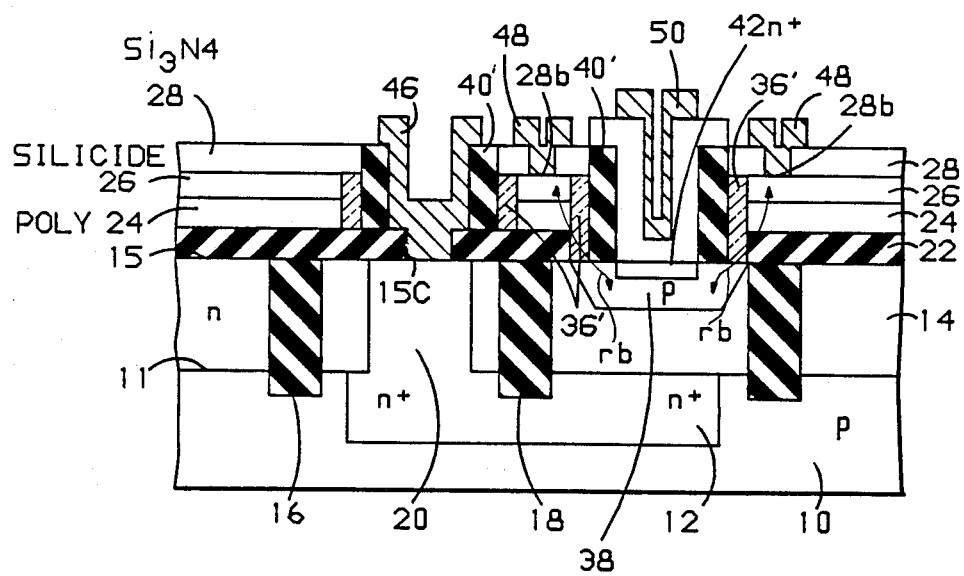

The completed device structure is illustrated in FIG. 7. Metal contacts to the collector, base, and emitter regions are formed to finalize the structure. In particular, oxide layer 22 in the region of top surface $15_c$ is opened and a metal collector contact 46 is formed to deep collector contact region 20. Similarly, a window is formed in nitride layer 28 in the region denoted $28_b$, and a metallized base contact 48 is made which touches the portion of silicide layer 26 in the base region. Lastly, metallized emitter contact 50 is formed over doped polysilicon layer 44.

As stated above, the structure of the present invention, through the utilization of buried silicide layer 26, exhibits an extrinsic base resistance which is substantially less than that associated with prior art devices. Extrinsic base resistance, denoted $r_b$ in FIG. 7, is that portion of the base resistance outside and above emitter region 42. In conventional arrangements, this resistance would be dominated by the sheet resistance of heavily-doped polysilicon layer 24. However, in accordance with the present invention, silicide layer 26 is formed to be electrically in parallel with polysilicon layer 24. Since the resistance of silicide is on the order of 0.5–4.0 ohm/square, as compared with 10–100 ohm/square for the doped polysilicon, the parallel combination of these two values is essentially the sheet resistance of silicide layer 26. Therefore, the extrinsic base resistance of the present transistor structure is essentially the sheet resistance of silicide layer 26. The shorted contact which forms the electrically parallel structure between layers 24 and 26 is provided by vertical portions 36' of undoped polysilicon, formed as described above. In particular, undoped polysilicon portions 36' can be thought of as a "wick" which provides a path for the movement of dopants from the heavily doped polysilicon layer 24 to the base region 38. The use of this three-dimensional vertical contact thus forms an extremely low resistance path between base resion 38 and the final external base contact. Since the silicide deposition process is extremely well-controlled, the variation in extrinsic base resistance from device-to-device, or even wafer-to-wafer, is considered negligible.

What is claimed is:

1. A high performance bipolar transistor structure comprising
    a monocrystalline silicon body of a first conductivity type;
    a buried collector region of a second conductivity type formed in a top major surface of said body;
    an epitaxial layer of said second conductivity type disposed over said top major surface of said body;
    a deep collector contact region formed in said epitaxial layer which connects said buried collector region to the top major surface of said epitaxial layer;
    a base region of said first conductivity type formed in the top major surface of said epitaxial layer above said buried collector region and separated from said deep collector contact region;
    an emitter region of said second conductivity type formed within said base region and extending to said top major surface of said epitaxial layer;
    said base region including an intrinsic base region located below said emitter region and an extrinsic base region located extending from said major surface and adjacent to said emitter region;
    a base contact region including
    an insulating layer disposed over said top major surface of said epitaxial layer above said buried collector region and adjacent to said base region;
    a heavily doped polysilicon layer of said first conductivity type disposed over said insulating layer;
    a silicide layer disposed over so as to completely cover said heavily doped polysilicon layer, wherein the resistance of said silicide layer is significantly less than the resistance of said polysilicon layer;
    a polysilicon region forming a vertical connecting region adjacent to said insulating, polysilicon and silicide layers and extending to the top major surface of said extrinsic base region, said polysilicon region forming a vertical connection between said extrinsic base region and said polysilicon and silicide layers, wherein the combination of said polysilicon and silicide layers provides a low extrinsic base resistivity; and
    a silicon nitride layer disposed over said silicide layer so as to overhang said insulating, polysilicon, and silicide layers such that said polysilicon vertical connection region is contained underneath the silicon nitride overhang region.

2. A high performance bipolar transistor structure as defined in claim 1 wherein the transistor further comprises
    an oxide region disposed to form vertical sidewalls adjacent to vertical polysilicon region, said vertical oxide region defining the outer boundaries of the emitter region.

3. A high performance bipolar transistor structure as defined in claim 2 wherein the emitter region is formed using ion implantation within the boundaries defined by the vertical oxide region.

4. A high performance bipolar transistor structure as defined in claim 2 wherein the vertical oxide region comprises a low temperature oxide material.

5. A high performance bipolar transistor structure as defined in claim 1 wherein the first conductivity is p-type conductivity and the second conductivity is n-type conductivity.

* * * * *